United States Patent [19]

Waltz

[11] 3,845,552

[45] Nov. 5, 1974

[54] METHOD OF MAKING AN ENCAPSULATED ASSEMBLY

[75] Inventor: Douglas G. Waltz, Richardson, Tex.

[73] Assignee: Varo Semiconductor, Inc., Garland, Tex.

[22] Filed: Apr. 23, 1973

[21] Appl. No.: 353,572

Related U.S. Application Data

[62] Division of Ser. No. 231,311, March 2, 1972.

[52] U.S. Cl. ................. 29/628, 29/629, 174/52 PE, 317/234

[51] Int. Cl. ................................................ H01r 43/00

[58] Field of Search .......... 29/628, 629; 317/234, 1, 317/3, 3.1, 4, 4.1; 174/DIG. 3, 52 R

[56] References Cited

UNITED STATES PATENTS

| | | | |
|---|---|---|---|
| 3,152,293 | 10/1964 | Ruben | 317/234 |
| 3,179,853 | 4/1965 | Kozacka | 317/234 |
| 3,264,248 | 8/1966 | Lee | 317/234 |
| 3,291,894 | 12/1966 | Sampson | 317/234 |
| 3,476,988 | 11/1969 | Zido | 317/234 |
| 3,483,440 | 12/1969 | Dulin | 317/234 |
| 3,492,157 | 1/1970 | Ito et al. | 317/234 |

FOREIGN PATENTS OR APPLICATIONS

| | | | |
|---|---|---|---|
| 976,441 | 11/1964 | Great Britain | 317/234 E |
| 925,062 | 5/1963 | Great Britain | 317/234 |

*Primary Examiner*—C. W. Lanham
*Assistant Examiner*—James R. Duzan
*Attorney, Agent, or Firm*—Olson, Trexler, Wolters, Bushnell & Fosse, Ltd.

[57] ABSTRACT

The illustrated embodiment of the present invention is directed to an electronic component which has the discrete electronic element connected in series with interconnecting wires and the two are encapsulated. The electronic element and interconnecting wires are fastened together by connecting joint means to form a series of such components and interconnecting wires. This series of components is fed through an encapsulating die structure which receives encapsulating material therein so that the entire series of components, including the interconnecting wires and connecting joint means, are encapsulated. The electronic elements are diodes and therefore can form high voltage rectifier assemblies which have a plurality of such diodes connected in series to form voltage divider networks having an increased reverse voltage rating. This enables the diode assemblies to be used as high voltage rectifiers in television receivers or the like.

9 Claims, 4 Drawing Figures

METHOD OF MAKING AN ENCAPSULATED ASSEMBLY

REFERENCE TO RELATED APPLICATION

This application is a division of copending application Ser. No. 231,311, filed Mar. 2, 1972.

BACKGROUND OF THE INVENTION

This invention relates generally to an encapsulating method and article formed thereby, and more particularly to a method of encapsulating a plurality of series connected electronic components. Specifically, the invention is concerned with encapsulating a plurality of series connected diodes of the type used for high voltage rectification in television sets or the like.

Heretofore, high voltage power supplies for television receivers have been relatively expensive in that they utilize high voltage rectifiers, either of the tube type or of the solid state type, which are themselves relatively expensive and which require much apparatus and insulation to prevent arcing between various components in the vicinity. Such high voltage rectifiers are generally connected to the flyback transformer of a television circuit and produce the ultor anode voltage for the picture tube. This may be in the order of 20 to 30 kilovolts. With such high voltage circuits arcing becomes a serious problem, and any elimination or reduction of elements in the vicinity of the circuit will reduce the possibility of arcing of high voltage to other components. Therefore, the sockets or other connecting terminals utilized in the high voltage circuits are also a source of trouble and should, if at all possible, be eliminated.

When utilizing vacuum tube rectifiers to produce the high voltage for the picture tube anode it is possible to utilize a single rectifier element, as vacuum tubes generally have a high voltage characteristic. However, when utilizing solid state rectifier units it is often necessary to connect a plurality of solid state rectifiers in series so that they act as a voltage divider network to distribute evenly the high voltage among the various individual rectifier components. Therefore, a solid state rectifier having a peak inverse voltage capability of 200 to 400 volts can be connected in series with ten other such devices and thereby provide a peak inverse voltage capability of 2,000 to 4,000 volts. Similarly, high voltage rectifiers having a peak inverse voltage of 1,000 to 2,000 volts can be connected in series to produce a total assembly having a peak inverse characteristic capable of withstanding 20,000 to 30,000 volts when ten or more of such units are used.

Briefly, the invention disclosed herein includes a method of manufacturing a rectifier structure having a length of wire connected to the anode and cathode electrodes thereof and wherein adequate encapsulation is provided about the diode structure to provide a moisture barrier having an extremely high electrical dielectric constant so as to substantially minimize the possiblilty of electric arcing. The diode structure, when encapsulated in accoardance with this invention, is mechanically superior at the connecting joint means where the interconnecting wires are fastened because of the added strength obtained by the encapsulating material. The rectifier assemblies can be used for high voltage systems ranging in the order of about 20,000 to 30,000 volts.

Assembly of the series connected rectifiers is accomplished by fastening the interconnecting wires to the anode and cathode leads extending from the rectifier. The interconnecting wires have insulation formed thereon which is substantially the same size as the rectifier body. The wire connection formed between the rectifier and the interconnecting lead or between adjacent rectifiers can be accomplished by any one of several means such as stapling, soldering, or welding or the like. The rectifier and wire assembly can be made on a continuous basis with a relatively long length of such assembly wrapped on a spool for storage until ultimate encapsulation of the assembly is necessary.

For encapsulation, the rectifier and wire assemblies are fed into an extruding die which has an input end to receive the series connected assembly, a central portion which receives a quantity of encapsulating material, and an output end from which a continuous line of encapsulated rectifiers are extracted. The quantity of insulating material that remains on the components is determined by the size of the output member of the extruding die. By maintaining the diode body and size of interconnecting wires substantially the same and of the same configuration, they can be fed through the encapsulating die efficiently and at relatively high speed.

After the series connected components and associated interconnecting wires are encapsulated they can be respooled for storage and subsequent processing or they can be processed into discrete units at that time. The electrical component of this invention can then be assembled into a piece of electronic equipment. For example, if the component is a rectifier, it can be soldered into position by utilization of the interconnecting wires and thus eliminate the use of a connecting socket.

Means can be used to locate the precise position of the rectifier element within the longitudinal encapsulated assembly. Such means can take the form of, for example, ultrasonic, magnetic, or sensing compressibility when the encapsulating material is a relatively soft rubber or plastic material. Once the actual diode position is located, the adjacent interconnecting wires fastened thereto can be severed and metallic end portions thereof exposed for soldering into a circuit.

Many objects, features and advantages of this invention will be more fully realized and understood from the following detailed description when taken in conjunction with the accompanying drawings wherein like reference numerals throughout the various views of the drawings are intended to designate similar elements or components.

DETAILED DESCRIPTION OF THE ILLUSTRATED EMBODIMENT

Figure 1:
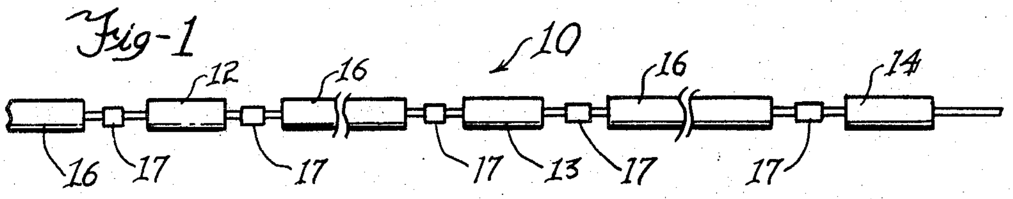
FIG. 1 is a diagrammatic illustration of a plurality of series connected electronic components to be encapsulated in accordance with the principles of this invention.

Referring now to FIG. 1 there is seen an assembly 10 of a plurality of serially connected electronic components 12, 13 and 14, etc. The electronic components 12, 13 and 14 are of a predetermined size and configuration. Preferably, the configuration is cylindrical but any configuration such as square, triangular or rectangular can be used. In the illustrated embodiment the electronic components 12, 13 and 14 are a plurality of series connected diodes having their anodes connected to the cathode of the next diode and so on to provide a series of low resistance elements in one current direction and a series of high resistance elements in the other current direction.

Each of the electronic components 12, 13 and 14 may be separated by an interconnecting wire 16 which is fastened to the lead wires thereof. The fastening is formed by a joint connecting means 17 which can be a stapling or crimping device. However, soldering or welding can be utilized also. The diameter of the interconnecting wire 16 is substantially the same as the diameter of the electronic components 12, 13 and 14. Should the electronic components have a square, rectangular or other configuration so also will the interconnecting wire have an outer configuration corresponding to that of the electronic components. After the electric components are connected in series, as shown in FIG. 1, they can be stored on a spool, not shown, for future use. However, they can be encapsulated in accordance with this invention immediately after connecting them in series as shown.

Figure 2:
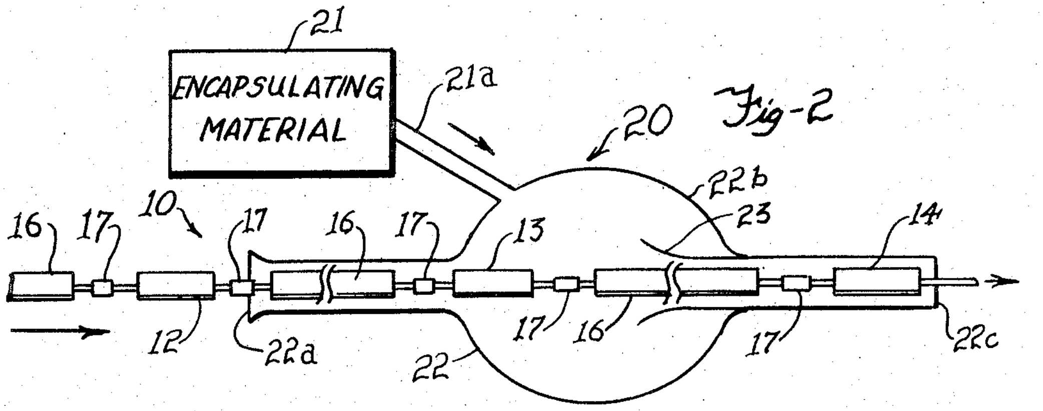
FIG. 2 illustrates an encapsulating die used to encapsulate the series connected components of FIG. 1.

Referring now to FIG. 2 the series assembly 10 is fed into an encapsulating apparatus 20 which includes a quantity of encapsulating material 21. The encapsulating material 21 may be stored in any suitable extrusion apparatus providing the necessary temperature and pressure for feeding the material into the interior chamber of an extruding die 22 via a conduit 21*a*.

The extruding die 22 has an inlet portion 22*a* into which the electronic components are fed, a central portion 22*b* into which a quantity of encapsulating material in a somewhat fluid state is supplied, and an outlet 22*c* from which the encapsulated series connected components are extracted. The series connected components are then covered with a homogeneous layer 23 of sufficient electrical dielectric strength so as to prevent moisture or other low dielectric constituents from coming into contact with the diode or electrical leads extending therefrom. When the assembly 10 consists of series connected diodes it can be used as high voltage rectifier component in a television set, or the like.

Figure 3:
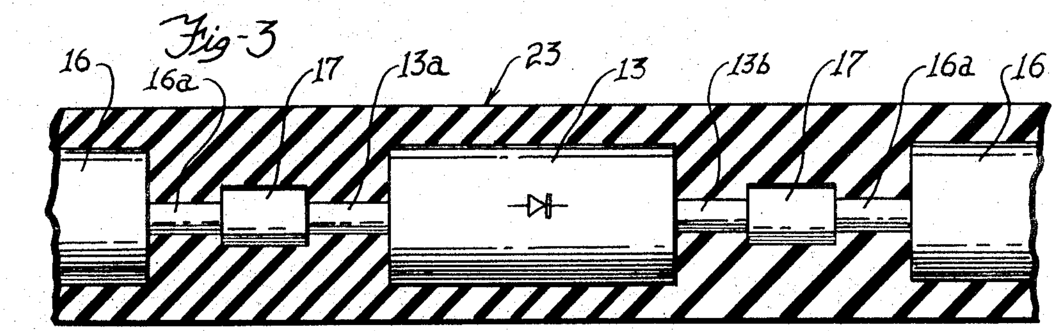
FIG. 3 is an enlarged partially sectional view showing the series connected units after encapsulation.

Referring now to FIG. 3 an enlarged detailed showing of the encapsulated assembly is illustrated. Here the electronic component 13, which is a diode, has the lead wires 13*a* and 13*b* thereof extending toward the interconnecting wires 16 and fastened to the uninsulated portions 16*a* by means of a connector 17. As mentioned above the connector 17 can be of any suitable type.

Figure 4:
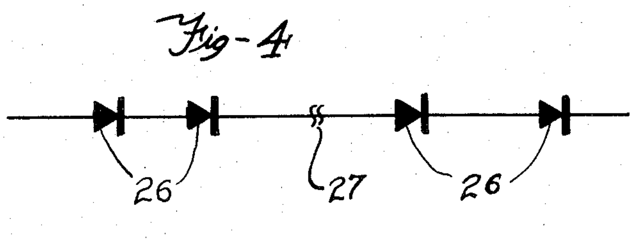
FIG. 4 is a schematic showing of a plurality of series connected diodes.

FIG. 4 illustrates schematically a series of diodes 26 which can be separated in pairs as indicated by the sever line 27. It will be understood that more than two diodes per assembly can be incorporated. To insure that the diodes are severed at locations between the diodes, i.e. through the interconnecting wire 16, appropriate means such as ultrasonic, magnetic or sensing compressibility of the resilient outer layer 23 can be used. The diode units are then prepared at the ends thereof by stripping the encapsulating material and the insulation off of the interconnecting wires 16 to expose the metal conductor passing therethrough for connection into the circuit.

What has been described is a simple and efficient means for providing a plurality of series connected electronic components, such as diodes or the like, and encapsulating such components by passing them through an elongated extruding die apparatus. While only a specific embodiment of the invention is disclosed, it will be understood that variations and modifications of this invention can be effected without departing from the spirit and scope of the novel concepts disclosed and claimed herein.

The invention is claimed as follows:

1. A method of making encapsulated electronic components comprising the steps of: selecting an electronic component including a central body of given, uniform cross-sectional size and shape and a pair of lead wires respectively extending axially from the opposite ends of said body; selecting interconnecting wire members having a cross-sectional size and shape closely corresponding to the cross-sectional size and shape of said central body; joining a said interconnecting wire member substantially end-to-end with each of said lead wires closely adjacent the central body corresponding respectively therewith to produce a serially connected assembly of substantially uniform, cross-sectional size and shape; temporarily locating said assembly in an encapsulation die having a central body portion of substantially uniform internal corss-section; and, during the residence of said assembly in said die, forming a quantity of encapsulating material of substantially uniform thickness over the exterior of said assembly in intimate contact therewith, whereby to provide an encapsulated electronic unit of substantially uniform cross-sectional size throughout its length.

2. A method according to claim 1 wherein said central body and said interconnecting wire members are cylindrical.

3. A method according to claim 1 wherein the forming of said encapsulating covering is applied by passing said assembly through an extruding die which has an entrance portion to receive said assembly, an intermediate portion to receive encapsulating material and transmit said assembly, and an exit portion for passing said assembly; and wherein the encapsulating material is introduced into said intermediate portion in a semifluid state.

4. A method according to claim 3 wherein said assembly is passed through said die at relatively high speed.

5. A method according to claim 1 wherein said assembly comprises additional ones of said electronic components and said interconnecting members joined into a serially connected chain.

6. A method according to claim 5 wherein the forming of said encapsulating covering is applied by passing said assembly through an extruding die which has an entrance portion to receive said assembly, an intermediate portion to receive encapsulating material and transmit said assembly; and an exit portion for passing said assembly; and wherein the encapsulating material is introduced into said intermediate portion in a semifluid state.

7. A method according to claim 6 wherein said assembly is passed through said die at relatively high speed.

8. A method according to claim 1 wherein said electronic component is a solid state electronic component.

9. A method according to claim 1 wherein said encapsulating material is applied to said assembly in an encapsulating die and wherein said assembly is introduced into and removed from said die in a relatively short period of time.

* * * * *